US012813159B2

(12) United States Patent
Mantese et al.

(10) Patent No.: US 12,813,159 B2
(45) Date of Patent: Nov. 24, 2026

(54) PIEZOELECTRIC STRUCTURE

(71) Applicant: Raytheon Company, Arlington, VA (US)

(72) Inventors: Joseph V. Mantese, Ellington, CT (US); Curtis B. Carlsten, Seekonk, MA (US); Mary K. Herndon, Littleton, MA (US)

(73) Assignee: Raytheon Company, Arlington, VA (US)

( * ) Notice: Subject to any disclaimer, the term of this patent is extended or adjusted under 35 U.S.C. 154(b) by 129 days.

(21) Appl. No.: 18/603,957

(22) Filed: Mar. 13, 2024

(65) Prior Publication Data

US 2025/0295035 A1 Sep. 18, 2025

(51) Int. Cl.

| | |
|---|---|
| ***H10N 30/092*** | (2023.01) |
| ***B28B 1/00*** | (2006.01) |
| ***B33Y 10/00*** | (2015.01) |
| ***B33Y 80/00*** | (2015.01) |
| ***H10N 30/00*** | (2023.01) |
| ***H10N 30/85*** | (2023.01) |
| ***H10N 30/88*** | (2023.01) |

(52) U.S. Cl.

CPC ........... *H10N 30/092* (2023.02); *B28B 1/001* (2013.01); *B33Y 10/00* (2014.12); *B33Y 80/00* (2014.12); *H10N 30/101* (2024.05); *H10N 30/852* (2023.02); *H10N 30/88* (2023.02)

(58) Field of Classification Search

CPC .. H10N 30/092; H10N 30/101; H10N 30/852; H10N 30/88; H10N 30/8554; H10N 30/097; B28B 1/001; B33Y 10/00; B33Y 80/00; B33Y 70/10; H04R 31/00; H04R 17/00; C04B 2235/6026; C04B 35/491; C04B 2235/665; B06B 1/0629

See application file for complete search history.

(56) References Cited

U.S. PATENT DOCUMENTS

| | | | |
|---|---|---|---|
| 8,364,514 | B2 | 1/2013 | Macbeth et al. |
| 10,611,694 | B2 | 4/2020 | Beaman et al. |
| 11,155,502 | B2 | 10/2021 | Brandt et al. |

(Continued)

FOREIGN PATENT DOCUMENTS

| | | | | |
|---|---|---|---|---|
| CN | 106316388 A * | 1/2017 | ........... | C04B 35/622 |
| DE | 10121271 A1 * | 11/2002 | ............. | H10N 30/50 |

(Continued)

OTHER PUBLICATIONS

Bernard et al. "Direct laser processing of bulk lead zirconate titanate ceramics", Materials Science and Engineering B, vol. 172, Aug. 2010, pp. 85-88 (Year: 2010).*

(Continued)

*Primary Examiner* — Daniel Pihulic

(74) *Attorney, Agent, or Firm* — Schwegman Lundberg & Woessner, P.A.

(57) ABSTRACT

An additively manufactured multilayered structure including a first ceramic layer, the first ceramic layer including a ceramic powder having piezoelectric characteristics and a second ceramic layer built over the first ceramic layer, the second ceramic layer includes a second layer of ceramic powder has piezoelectric characteristics built on the first layer. At least a portion of the second ceramic layer is sintered and set over the first layer.

20 Claims, 8 Drawing Sheets

(56) References Cited

U.S. PATENT DOCUMENTS

| | | | | |
|---|---|---|---|---|
| 11,426,818 | B2 | 8/2022 | Schiffres et al. | |
| 2005/0004714 | A1 | 1/2005 | Chen | |
| 2006/0287780 | A1 | 12/2006 | Hutton | |
| 2007/0300174 | A1 | 12/2007 | Macbeth et al. | |
| 2017/0137327 | A1 | 5/2017 | Capobianco et al. | |
| 2017/0165865 | A9 | 6/2017 | Joshi et al. | |
| 2022/0410269 | A1 | 12/2022 | Miko et al. | |
| 2025/0295035 | A1 * | 9/2025 | Mantese | H10N 30/101 |

FOREIGN PATENT DOCUMENTS

| | | | | | |
|---|---|---|---|---|---|
| DE | 20023051 | U1 | * | 1/2003 | H10N 30/8554 |
| EP | 3769924 | A1 | | 1/2021 | |
| EP | 4049988 | A1 | | 8/2022 | |
| JP | 2004137106 | A | * | 5/2004 | |
| WO | WO-2014047283 | A1 | | 3/2014 | |
| WO | WO-2022055924 | A1 | * | 3/2022 | B33Y 80/00 |
| WO | WO-2025193840 | A1 | * | 9/2025 | B28B 1/001 |

OTHER PUBLICATIONS

Translation of CN106316388 (Year: 2017).*

"International Application Serial No. PCT/US2025/019584, International Search Report mailed Jun. 26, 2025", 4 pgs.

"International Application Serial No. PCT/US2025/019584, Written Opinion mailed Jun. 26, 2025", 16 pgs.

"Piezoelectric Devices Market Size, Share and Trends, 2025 to 2030", [Online]. Retrieved from the Internet: <https://www.marketsandmarkets.com/Market-Reports/piezoelectric-devices-market-256019882.html>, (Dec. 2024), 15 pgs.

Bagrov, V V, et al., "Development of The Basics of The Method of Selective Laser Sintering of Metal-Polymer Powder Compositions", With English Machine Translation, Preprint Fiz. Inst. Akad. Nauk.,, (Jan. 1, 1996), 34 pgs.

Gureev, D M, et al., "Selective laser sintering of PZT ceramic powders", Technical Physics Letters., vol. 26, No. 3, (Mar. 1, 2000), 262-264.

Hong, Kootak, et al., "Perspectives and Challenges in Multilayer Ceramic Capacitors For Next Generation Electronics", Journal of Materials Chemistry C Issue 32, (2019), 23 pgs.

Huang, Zhiming, et al., "Optical Properties of PbZrxTi1xO3 On Platinized Silicon By Infrared Spectroscopic Ellipsometry", Applied Physics Letters vol. 76 Issue 26, (Jun. 2000), 4 pgs.

Shishkovsky, I, et al., "Layering fabrication, structure, and electromagnetic properties of perovskite phases by hybrid process: self-propagated high-temperature synthesis and selective laser sintering", Phase Transitions., vol. 86, No. 11, (Nov. 1, 2013), 1085-1093.

* cited by examiner

PIEZOELECTRIC STRUCTURE

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Copyright Raytheon Technologies. All Rights Reserved.

TECHNICAL FIELD

This document pertains generally, but not by way of limitation, to piezoelectric structures with ceramic layers formed by additive manufacturing and methods of manufacturing the layered structure in an original location.

BACKGROUND

The piezoelectric effect is a conversion of mechanical stress to electricity or electricity to mechanical stress. Piezoelectric devices include, for example, actuators that convert mechanical stresses such as displacement or deformation into electricity. For example, materials having piezoelectric properties transform strain, stress, or vibration energy into electrical energy. The converse piezoelectric effect occurs when an electrical signal is converted into mechanical displacement or deformation.

Materials exhibiting piezoelectric qualities are classified as crystalline, ceramic or polymeric. Crystalline piezoelectric materials include, for example, quartz, tourmaline, or Rochelle salt. Ceramic materials having piezoelectric properties include, for example, lead zirconate titanate (PZT), barium titanate, and lead titanate. An example of a piezoelectric polymer includes polyvinylidene fluoride (PVDF).

Additive manufacturing (e.g., 3D printing or rapid prototyping) is one way of manufacturing a structure that includes forming material layers to form a structure. In some examples, additive manufacturing utilizes computer aided design tools, or three-dimensional scanners, to set the design (dimensions, profiles, or the like) of the structure.

In examples, additive manufacturing deposits a single material on a base plate. The single material is, for example, a polymer, a metal, a glass, or a food product or the like. The single material, for example, sets after application such as plastic cooling after deposition. In an example, the next layer is deposited on the self-set, cooled or set material. In some examples, a single material is a first layer, and a subsequent layer is a different material. Additive manufacturing then deposits subsequent layers on the base layer. The additive manufacturing process then continues deposition of material, layer by layer, according to the design provided by the CAD tool until a final product is achieved.

OVERVIEW

The present inventors have recognized that a problem to be solved includes simplifying a manufacturing process for structures including ceramics or metals. In some examples, the structure is formed from the material that includes piezoelectric properties such as ceramics. Optionally, the structure is a layered structure where the layers are not all made from the same materials. For example, a first layer is a layer of a ceramic-based material and a second, or subsequent layer, is a metallization layer. In examples, the piezoelectric materials of these layers do not self-set or only partially set after application (e.g., by cooling, chemical reaction or the like). Accordingly, it is difficult to additively manufacture with materials, such as piezoelectric materials as additional layers are laid over previous layers that have not set.

In examples of manufacturing a layered structure, a first layer is deposited on a base, or build plate. The first layer is a ceramic slurry formed from a ceramic powder and a liquid. The first layer is applied in a liquid state and set to a solid state by tape casting the slurry to form a solid layer. The solid layer is then stacked and laminated with additional layers that are similarly formed (e.g., applied as a liquid and then set). The layer is then cut or diced to form the desired sizes and shapes. Optionally, other cut or diced layers are laminated on previous cut or diced layers. The layer is then subjected to a binder burnout and then sintered. The layer is then subjected to a termination firing step to finalize the form of the layer. To add further layers to the stack, the process is continuously repeated until the final product is achieved.

In examples, the product is removed from the cycle to form additional geometries, such as forming gaps, recesses or cavities, in the final product. Optionally, removing the product from the cycle occurs before forming the final product if the geometry is desired in intermediary layers. Material is then removed from the product with processes such as etching, focused ion beam lithography or the like.

In one example, the present subject matter includes a method for additive manufacturing of a structure including ceramics or metals that consolidates the steps of application, sintering, and additive layering into a composite in-situ process. In additive manufacturing, the build process occurs in one location, or in-situ. A structure is formed on a build plate within a single workspace. Each subsequent layer in an additive manufacture product is formed on the previous layer without moving the first, or set layer, from the location the layer is formed. As described above, ceramic slurry materials are applied as a liquid, are then sintered, and the resulting solid layer is cut apart (diced or singulated). These component dice (singulated components from the solid layer) are then laminated together. Sintering and singulating of the layers break up the additive manufacturing process that builds on solid layers and accordingly frustrates the implementation of additive manufacturing.

In an example, the methods described herein form an additively manufactured layered composite structure in an in-situ manner. The structure optionally has piezoelectric characteristics. The method includes forming a control layer on a build plate then depositing a first slurry (liquid) layer of ceramic powder on the control layer. The layer of ceramic powder includes a plurality of ceramic particles. The layer of ceramic powder (a slurry) is sintered to set the melted sintered ceramic particles after application of the slurry. Setting the ceramic particles by way of sintering forms a solid first ceramic layer having piezoelectric characteristics. Because the first layer is solid a second layer of ceramic powder (a slurry) readily applied over the first layer and is sintered itself to permit additive construction of additional layers.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Layered products include composite structures which are, for example, components used in computer systems, mechanical applications such as automotive, aerospace, nautical, or HVAC systems, sensors or detectors. In some examples, the layered structures are constructed by forming each layer, individually, then stacking and coupling the layers together. In some examples, through vias, cooling columns, capacitors, electrodes, or other components or systems are coupled to a layer during the manufacturing process. Subsequent layers are then stacked on a layer with the components or supporting the components.

The layered product having several steps is implemented. Forming the layered product includes several steps that, in some examples, includes moving or relocating the material used to form the layer to different locations to perform the next step in the process of forming the layer. In some examples, the process including the several steps is repeated until the layered product is finalized. For example, in forming a layered product including ceramic layers includes depositing a ceramic slurry onto a flexible tape, then drying the ceramic slurry to form a thin flexible layer of the ceramic. The thin, ceramic layer, in examples is cut and stacked on a preceding layer. This process is repeated until a desired stack including ceramic layers is formed. The ceramic layers are, in some examples laminated together. The laminated stack is diced, etched or cut to form recesses, gaps or other textures in the stacked layer. Optionally, the individual stacked layers are then subjected to a binder burnout where unwanted materials, such as binders, are removed from the individual, stacked layers. In some examples, the individual, stacked layers are then sintered together to join the layers together. Finalization processes, in some instances, are then performed to the layer. In some examples, after the finalization process, further layers are added to the finalized stacked layer. While ceramic is stated as related to this method, similar methods are implemented with other materials such as glass, metal, polymers or the like. Moving the layers through the repetitive process, in some examples, is time consuming and cumbersome process.

In other examples of stacking layers in a process where each layer is individually moved through a process can damage individual layers, cause misalignment of layers, or result in uneven layers. Damage or misalignment, in some examples, occurs during etching, dicing or cutting areas within individual or stacks of layers.

Figure 1A:
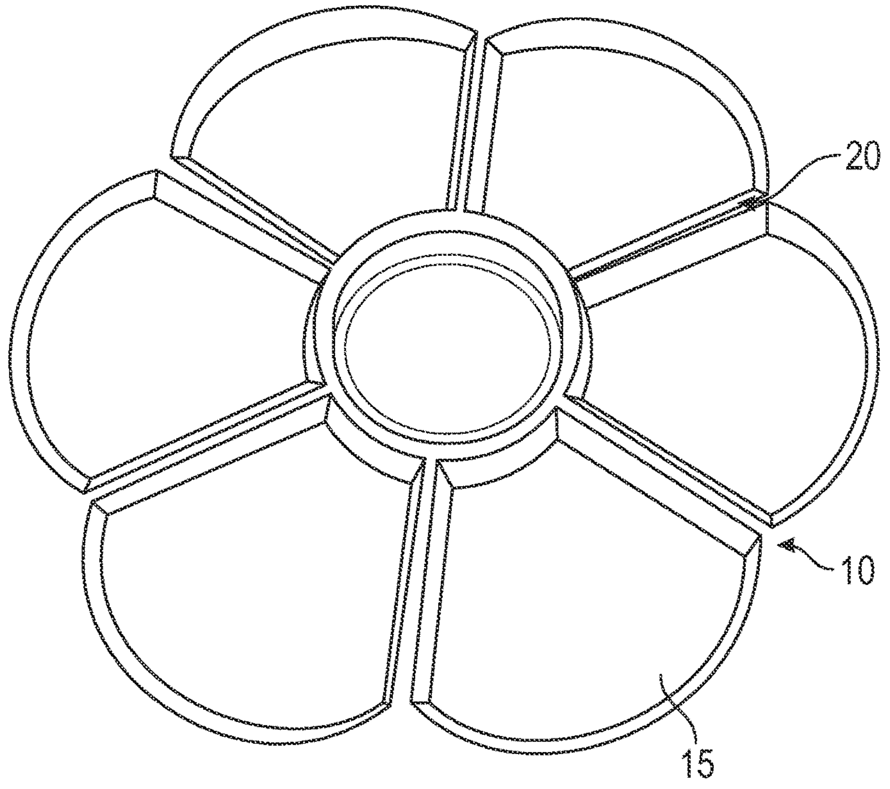
FIGS. 1A and 1B illustrate a top view of a layered composite structure according to at least one example of the present disclosure.
Figure 1B:
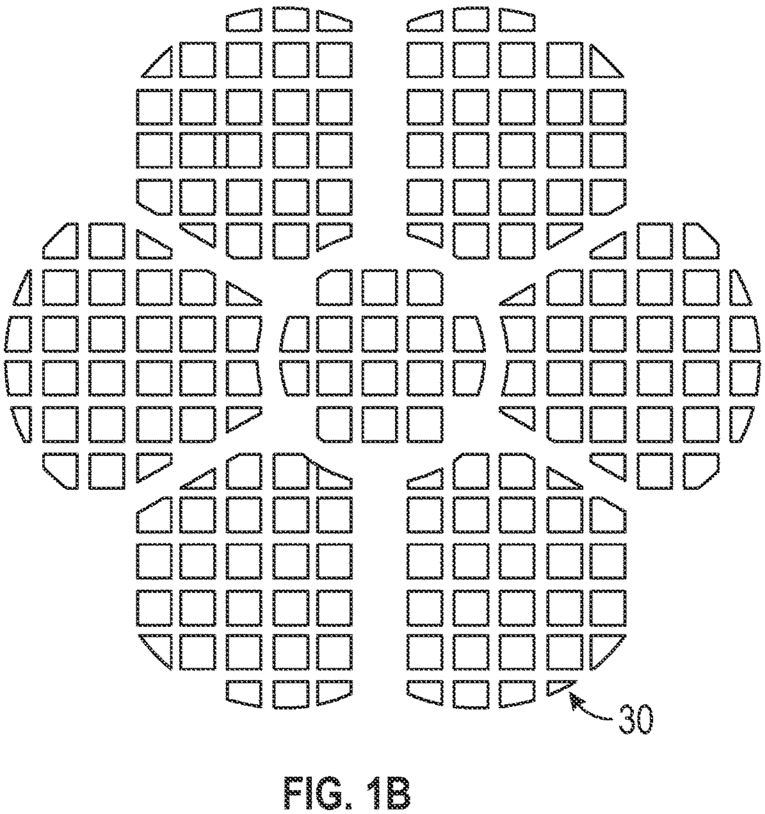

As illustrated in FIGS. 1A and 1B, the layered structure 10 is formed from subtractive patterning. In an example, the ceramic layers are stacked and formed into sheets, blocks, or the like. The sheet or block layered structure 10 is optionally subjected to subtractive patterning. As illustrated in FIG. 1A, material is removed from the layered structure 10 to form recesses 20 between sections of remaining material. In an example, subtractive laser etching applied to the structure to form recesses 15 (e.g., indentations, holes or the like). Illustrated in FIG. 1B is another example of subtractive patterning including a cross-hatch pattern 30 of removed material. The removal process occurs after forming the layered structure 10, as an additional step in the manufacturing process of forming a layered composite structure The present inventors have recognized that a problem to be solved involves a manufacturing process for manufacturing a layered, composite structure. In an example, the process includes forming a layered, composite product by minimizing relocating individual layers. In an example minimization includes decreasing the relocation of layers from one spot or apparatus to another to either add additional layers or process a layer.

In one example, a manufacturing method that minimizes relocating a layer, or stack of layers, through several different locations, includes a process known as additive manufacturing. Additive manufacturing, or three-dimensional (3D) printing is a process where layers are built one at a time, one on top of the other. Additive manufacturing is a process that including building one layer on top of another in a single location or the original location, or "in situ".

For example, during additive manufacturing layers are individual formed on a build plate, or another such supportive substrate. The subsequent layer can include a layer formed from the same material or the subsequent layer can include a layer formed from a different material. For example, a first layer can include a ceramic layer and a subsequent layer can include the same ceramic layer. In another example the first layer can include a layer formed from a ceramic and a subsequent layer formed from a metal layer. Components, such as electrode, capacitors or the like, in examples are inserted into or between layers.

Using additive manufacturing to build layered products, in some examples, decreases the amount of time it takes to form a layered product. For example, the decreased time comes from removing the time of moving a layer from one location to another. In other examples, additive manufacturing minimizes or eliminates intermediary steps. Such intermediary steps include, for example, a separate step for cutting or etching. Other steps include a separate step for laminating or joining layers together.

Additive manufacturing is also used, for example, to build products that include layers, recesses, gaps or the like without cutting or etching. In example, layers are formed that include recesses, gaps or the like. For instance, subsequent layers also include similarly located recesses or gaps such that the recesses or gaps extend through one or more layers of the additively manufactured product.

During the building process of an additively manufactured product, layers are joined, for example with an application of heat to the layer being formed. In other examples, the preceding layer is not fully cooled, and the subsequent layer is joined with the preceding layer when the two layers are set, or cooled, together. Thereby, the preceding layer and subsequent layer are joined together forming a layered structure.

Layered structures include, for example, those having piezoelectric characteristics. Layered structures including piezoelectric characteristics can include structures built with any of the materials having piezoelectric characteristics. Materials that include piezoelectric characteristics include certain polymers, metals and glass or glass like materials such as ceramics. In examples, materials exhibiting piezoelectric characteristics are classified as crystalline, ceramic or polymeric. Crystalline piezoelectric materials include, for example, quartz, tourmaline, or Rochelle salt. Ceramic materials having piezoelectric properties include, for example, lead zirconate titanate (PZT), barium titanate, and lead titanate. An example of a piezoelectric polymer includes PVDF.

Piezoelectric characteristics include the ability of the material to convert mechanical stresses or forces to electricity. In an example, a force, such as the reception of a sound wave engages with the molecular or atomic structure of the piezoelectric material. The reception of, for example, the sound wave causes a reaction in the molecular or atomic structure and converts the received forces to electricity.

In another example, a converse piezoelectric effect occurs if the material having a piezoelectric characteristic receives an electrical field. In an example, reception of an electrical field is converted on a molecular or atomic level to a mechanical force. In examples, the mechanical force is a deformation or displacement of the material.

Certain ceramics are an example of a material having piezoelectric characteristics used to build structures that benefit from having piezoelectric characteristics. Optionally, to build a structure having piezoelectric characteristics, layers of certain ceramics are formed one layer at a time. In an example, the layers are stacked, laminated, cut or etched, diced, subject to a burnout, then sintered, smoothed or polished, subject to a second firing or baking. The process is then repeated until the final structure is formed. The present inventors have recognized a method of additively manufacturing a layered composite structure having piezoelectric characteristics.

In an example of a method of manufacturing a layered composite structure having piezoelectric characteristics, the method includes an additive manufacturing process. The additive manufacturing process eliminates, for example such processes such as removing the layer from one location to another to complete the next step in the process. In some examples, an additive manufacturing process also eliminates one or more of processes such as etching, binder burnout, post baking, or others.

An additive manufacture process usually occurs in one location, or in situ. The one location is, for example in one receptacle, container, area or the like. For instance, during an additive manufacturing process, a layered structure is formed by building a new layer of material on a previously formed layer. The new layer is deposited on a solidified layer in a form where the new layer is not solidified. In an example, during an additive manufacturing process the new layer can be a slurry, powder or other particulate that is deposited on the previous layer.

Figure 2:
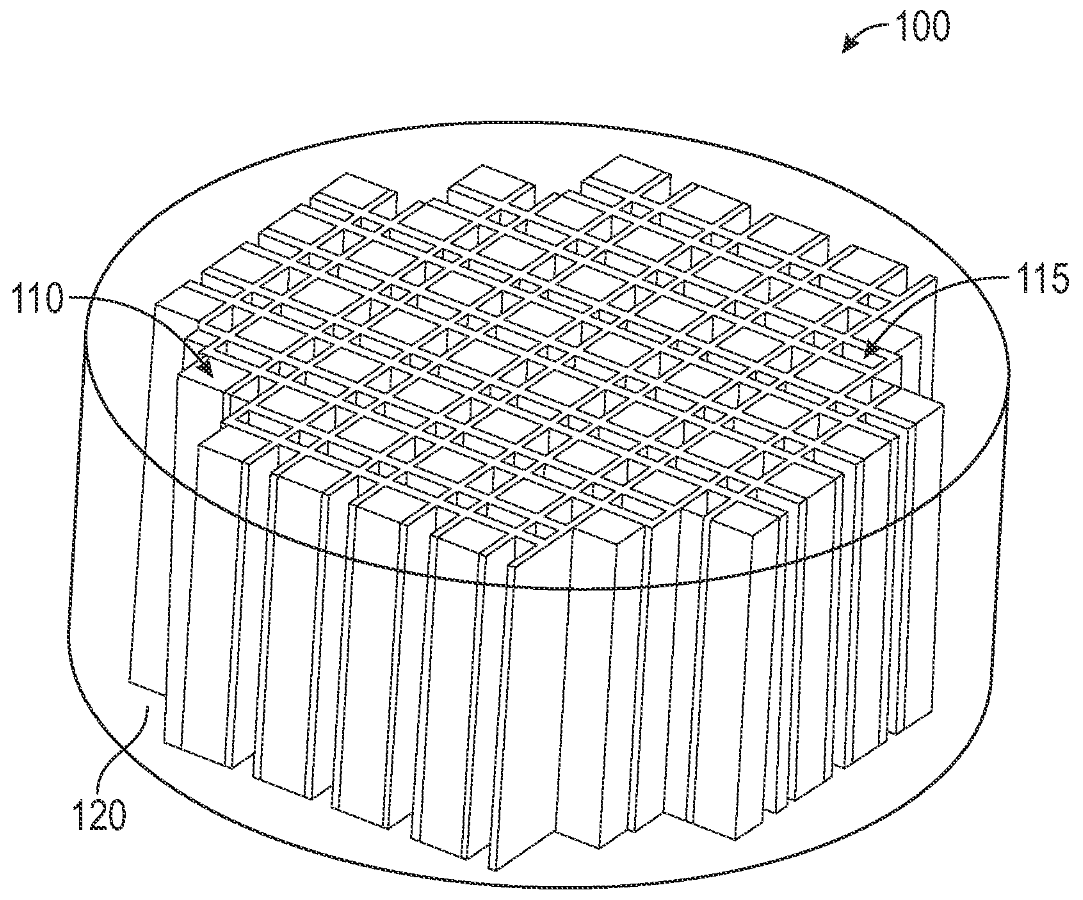
FIG. 2 illustrates a piezoelectric structure according to at least one example of the present disclosure.

Illustrated in FIG. 2 is an example of a composite layered structure 100. In one example the composite layered structure 100 is a component of a sonar device. In another example, the composite layer structure 100 is a component of a sensor such as a vibration sensor. Piezoelectric structures 100 are also optionally components of actuators or transducers.

The composite layered structure 100 includes, for example, a plurality of piezoelectric columns 110. The piezoelectric columns 110 are, for example, spaced from each other with a gap 115 (e.g., recess, spacing, cavity or the like). In an example, the piezoelectric columns 110 are an example of a plurality of additively manufactured composite layered structures. In another example, the piezoelectric columns 110 are part of one additively manufactured composite layered structure. In an example, the piezoelectric columns 110 are encased, surrounded by or included in a polymer 120 substrate.

Figure 3A:
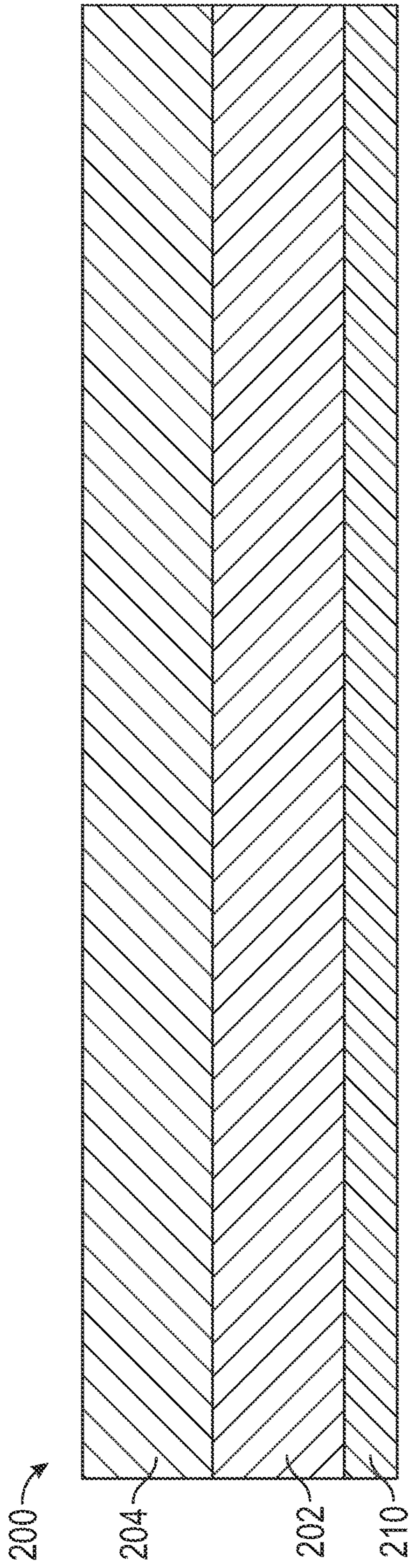
FIGS. 3A and 3B illustrate a cross section of an additive manufactured composite structure according to at least one example of the present disclosure.

As illustrated in FIG. 3A, the composite layered structure 200 is a piezoelectric transducer formed using, for example, additive manufacturing methods. The example composite layered structure 200 includes at least a first layer 202 and a second layer 204. While the composite layer structure 200, as illustrated, has two layers, a plurality of subsequent layers are optionally built on top of the second layer 204.

In an example, the first layer 202 is built on a build plate 210. For instance, the first layer 202 includes a ceramic material that is formed from a ceramic powder that has been sintered into melt, bind or otherwise join the ceramic particles together. The first layer 202 in other examples includes a ceramic material having piezoelectric characteristics. One example ceramic is PZT or includes PZT.

In an example the first layer has a deposition configuration and a set configuration. In the deposition configuration a powder, such as a ceramic powder, is applied over a previous layer as a powder layer. Optionally, the powder in the deposition configuration is a powder as a component of a slurry. In the set configuration the powder, such as a ceramic powder, is sintered over the previous layer as a sintered layer.

The composite structure 200 includes a second layer 204, or a subsequent layer. The second layer 204 is an additional layer that is built on the first layer 202. For example, the second layer 204 has a deposition configuration where the second layer is a second powder (e.g., particulate) ceramic material deposited on the first layer 202. The second layer 204 then has a set configuration where the ceramic powder (e.g., particulate) is sintered on the formed (e.g., set, solidified) first layer 202 (e.g., the set configuration of the first layer).

In an example the second layer has a second deposition configuration and a second set configuration. In the second deposition configuration a powder, such as a ceramic powder, is applied over a previous layer, such as the first layer, as a powder layer. Optionally, the powder in the deposition configuration is a powder as a component of a slurry. In the set configuration the powder, such as a ceramic powder, is sintered over the previous layer, such as the first layer, as a second sintered layer.

The second layer 204 is, in some examples, the same material as the first layer 202. In other examples, the second layer 204 is a different material. The second layer 204 is optionally a different ceramic material or a metal layer. In an example, the second layer 204 has piezoelectric characteristics. In another example, the second layer 204 is formed to be a conductor and has conductive characteristics that enable effective and efficient transmission of electricity through the composite layered structure 200.

Figure 3B:
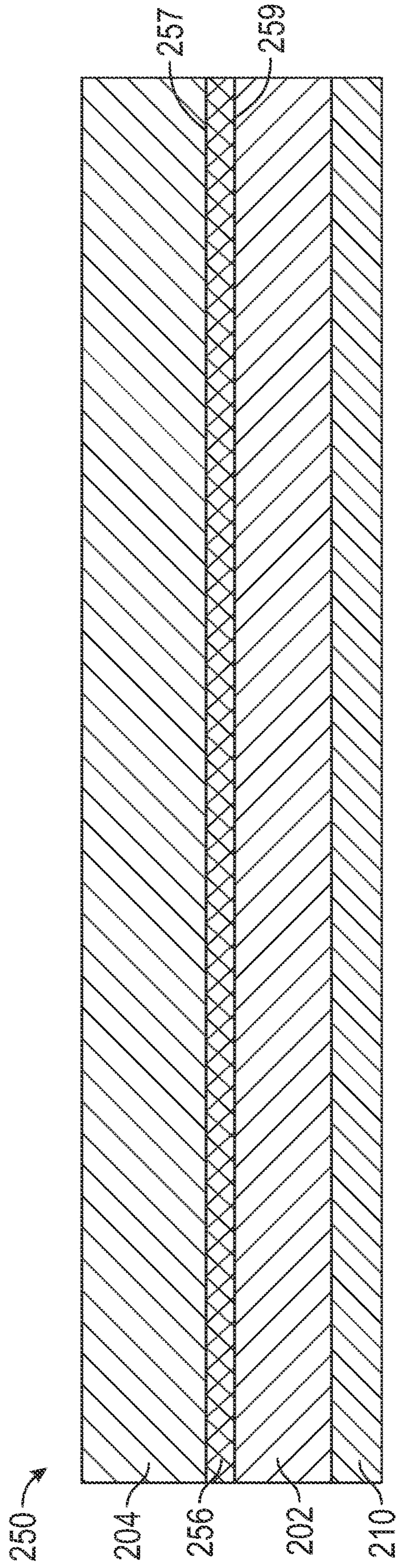

Illustrated in FIG. 3B is an example of another form of a composite layered structure 250. The composite layered structure 250 includes, for example a first layer 202 similar to the first layer of FIG. 3A and a second layer 204 similar to the second layer of FIG. 3A. In the example illustrated in FIG. 3B is an intermediary layer 256 built on the first layer 202. The intermediary layer 256 is, for example, a metal layer. The intermediate layer 256 is optionally a conductive metal. For example, nickel, platinum, copper or other metal that acts as a conductor for electricity is used as a metallization layer. In examples, the metallization layer has a higher conductivity than the ceramic layer. In another example the intermediate layer 256 has piezoelectric characteristics. For example, the intermediate layer 256 is formed from aluminum, titanium, copper, iron or the like. In another example, the intermediate layer 256 is a ferrite with both piezoelectric and conductive properties. For example, the intermediate layer 256 has higher conductivity than at least one of the first layer 202 or the second layer 204.

In an example, the intermediate layer 256 has a deposition configuration. In the deposition configuration, the intermediate layer is deposited (e.g., placed, spread) in a particulate or liquified (e.g., slurry) form on the first layer 202. The deposition configuration is an initial configuration of the intermediate layer built on the first layer 202. The particulate intermediate layer, in an example, has a set configuration where the intermediate layer is sintered, melted, heated or cooled to form a set (e.g., solidified) intermediate layer.

In examples with the intermediate layer 256, the second layer 204 is built on a surface 257 of the intermediate layer 256 opposite to the surface 259 of the intermediate layer 256 joined to the first layer 202. The second layer 204 built on the surface of the intermediate layer 256, similar to FIG. 3A, has a deposition configuration when the material for the second layer is deposited on the intermediate layer 256. The second layer 204 then has a set configuration, similar to that described related to FIG. 3A.

In examples, the layered composite structure that is additively manufactured with ceramic materials, the structure has a depth dimension suitable for the desired purpose. For example, in examples of additively manufacturing parts or devices for the aerospace, automotive or manufacturing industries, the additively manufactured part or device is larger than the additively manufactured parts or devices used in computers or sensors. For example, the ceramic structure is between approximately 0.1 millimeter deep to a meter or more deep. In an example, the layered composite structure having piezoelectric characteristics is between approximately 0.1 millimeters and approximately 1 centimeters in depth. In an example, the layered composite structure is between approximately 0.5 millimeters and approximately 5 millimeters. In another example, the composite layered structure is between approximately 1 millimeter and approximately 1 millimeters.

In examples, the dimensions of the additively manufactured layered composite structure are irregular throughout the structure. For example, the additively manufacture composite structure has a pattern resulting in altering depths and heights throughout the structure. In other examples, the recesses in the additively manufactured structures are different according to the desired purpose. For example, the width of a cooling channel has one width and depth in one location and a second channel designed to receive an electrode extends through at least a portion of the additively manufactured structure having a different width or depth.

Figure 4:
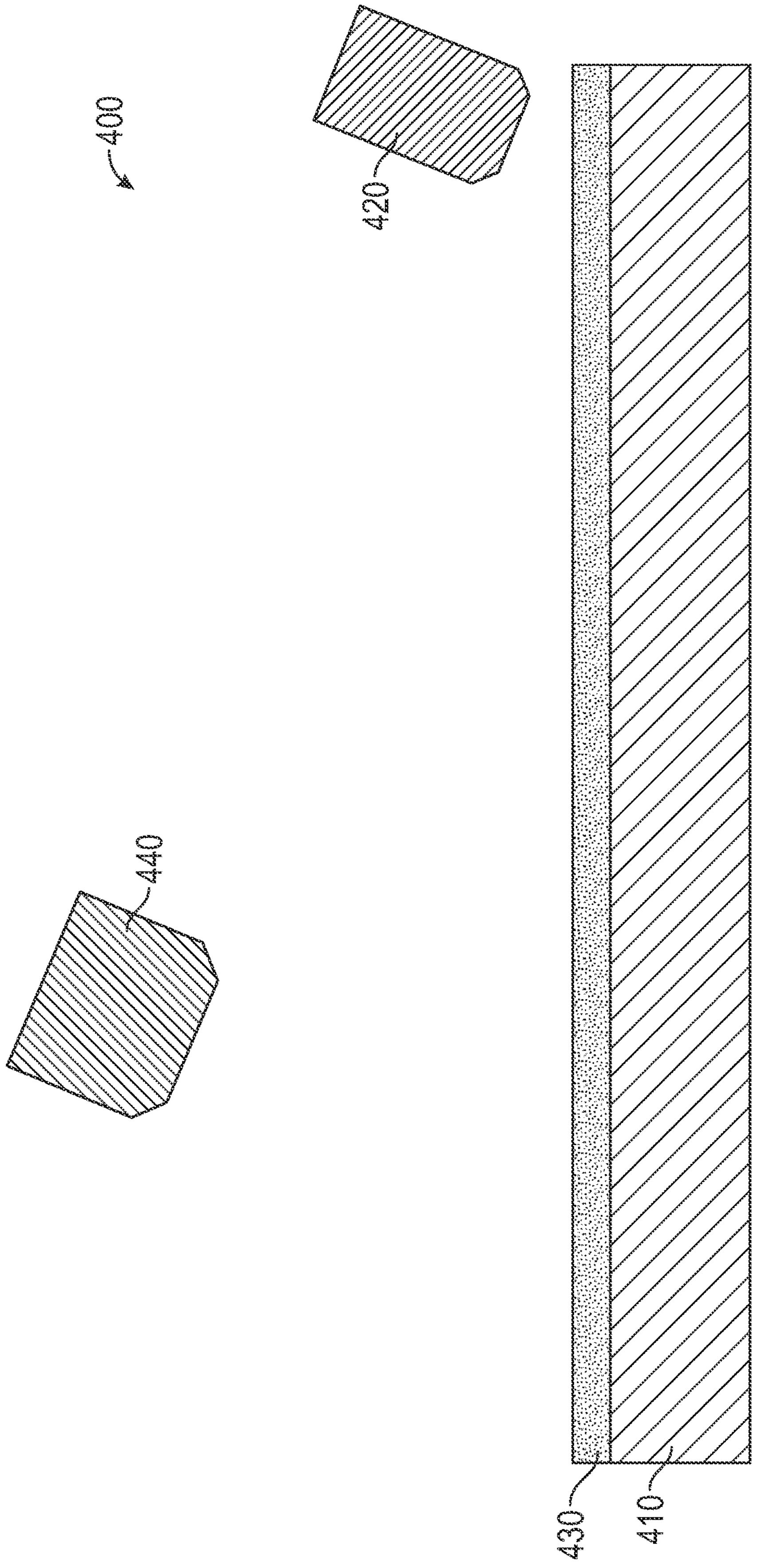
FIG. 4 illustrates a method of additively manufacturing a composite structure according to at least one example of the present disclosure.

FIG. 4 illustrates an example of a system 400 used in a method to form an additively manufactured layered composite structure. In an example, the additively manufactured layered composite structure is a structure including at least a ceramic material. The ceramic material, in some examples, has piezoelectric characteristics. As illustrated in the system 400 used to form an additively manufactured layered composite structure is a system in which the additively manufactured layered composite structure is built, or formed, in one location (e.g., in situ).

In an example, the system 400 includes a build plate 410 and a material source 420. The material source 420, in examples, deposits a layer of powder on the build plate 410. The build plate 410 in some examples has a textured surface. The build plate, in some examples is formed from a crystalline material, PZT or other ceramic. Optionally, the build plate 410 is heated using localized heating or a laser heating.

After the build plate 410 is prepared for reception of a deposition of a composite powder or a composite slurry of a material, the first layer deposited on the build plate 410 is a template layer 430. The template layer 430 in some examples includes a deposition of a ceramic powder, such as a crystalline material or PZT.

In another example, the material source 420 deposits the material as a slurry such as a ceramic slurry. The template layer 430 is optionally a base layer or a substrate on which subsequent layers are built or formed. In examples, the template layer 430 is a layer that is removed after the layered composite structure is formed or built. In another example, the template layer 430 remains coupled, joined or attached to the layered composite structure.

In examples, the deposition of powder, slurry or the like is melted (if a powder) or sintered and then cooled or set to form a solidified layer ad the template layer 430. For example, the powder is melted or sintered with a laser source 440. The laser for instance melts or sinters the deposited material to form the solidified template layer 430. The template layer 430 is optionally has a relatively smooth surface, textured surface or patterned surface.

The laser source 440 used for sintering or melting the deposited material is a laser such as a YAG laser, terbium laser or a $CO_2$ laser. Using a YAG laser allows a more precise application of the laser than a $CO_2$ laser. The specific laser used is dependent on the specified purpose.

Figure 5:
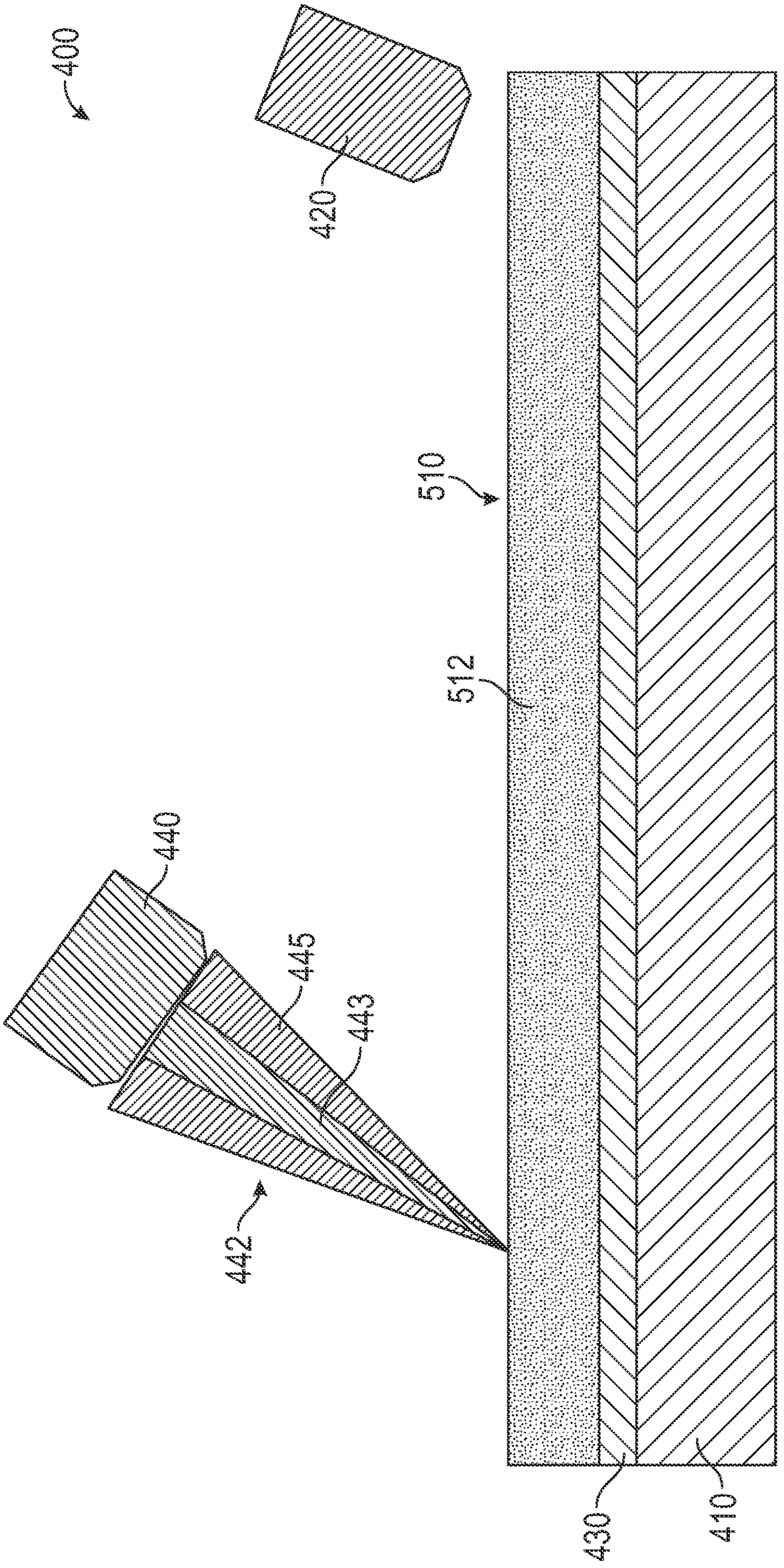
FIG. 5 illustrates a method of additively manufacturing a composite structure according to at least one example of the present disclosure.

Illustrated in FIG. 5 is an example of the next step in a process of additively manufacturing a layered composite structure. In examples, a first layer 510 of a ceramic material is deposited on a template layer 430. In examples, the ceramic material is lead zirconate titanate (PZT), ferrite, a ferroelectric or dielectric material or the like. Optionally, the first layer 510 is a ceramic material that is deposited on the build plate 410. The ceramic material optionally has piezoelectric characteristics. The deposited ceramic material is deposited, for example, in as a powder or a slurry. In an example, the ceramic material is deposited as a ceramic powder 512 consisting of a plurality of ceramic particles. In another example, the deposited ceramic material is a ceramic dispersion in isopropyl alcohol (IPA), acetone or the like. In some examples, a slurry forms a uniform coating of the ceramic material. In other examples, a ceramic powder forms a uniform coating. Optionally, the deposited ceramic powder 512 includes other particulate materials. The deposited ceramic powder 512 deposited, for example, across the template 430 or the build plate 410. In an example the deposited ceramic powder 512 is deposited in specific locations according to the specified purpose on the template 430 or the build plate 410. In examples, the deposited ceramic powder 512 is deposited to include spaces or gaps between areas of deposited ceramic powder 512.

After the ceramic powder 512 is deposited on the template 430 or the build plate 410, the laser source 440 emits a beam of energy towards the deposited ceramic powder 512. The laser 442 is emitted according to the intensity and with the wavelengths for the specified purpose. In an example, the laser 442 is emitted as two elements 443, 445. In an example, a high intensity beam 443 is emitted at a higher intensity than a low intensity beam 445. For instance, the high intensity beam 443 is emitted for sintering the ceramic powder 512. The low intensity beam 445 optionally is a broader, lower intensity beam. The low intensity beam 445 is emitted to, for example, control the rate of cooling, or setting, by providing supplemental localized heating beyond the local sintering zone. Emitting a high intensity beam 443 followed by a low intensity beam 445, in some examples, prevents thermally induced stress or fracturing of the layer being set. In an example, the laser 442 is emitted toward the deposited ceramic powder 512 to sinter specified areas of the deposited ceramic powder 512. In examples, the laser 442 sinters the entire area, majority or specified locations of the deposited ceramic powder 512 such that the deposited ceramic powder 512 is melted and the particles join together. The deposited ceramic powder 512 is then set or cooled to form a least a portion of the first layer 510.

In examples, the first layer is a first ceramic layer. The first ceramic layer 510 is optionally a continuously extending first ceramic layer 510. The continuously extending first ceramic layer 510 covers, for example, the template layer 430 or the build plate 410 such that the first ceramic layer 510 has the same texture, whether smooth, patterned or the like. In other examples, the first ceramic layer 510 includes recesses, gaps or other spacing between areas of the sintered and set first ceramic layer 510.

Figure 6:
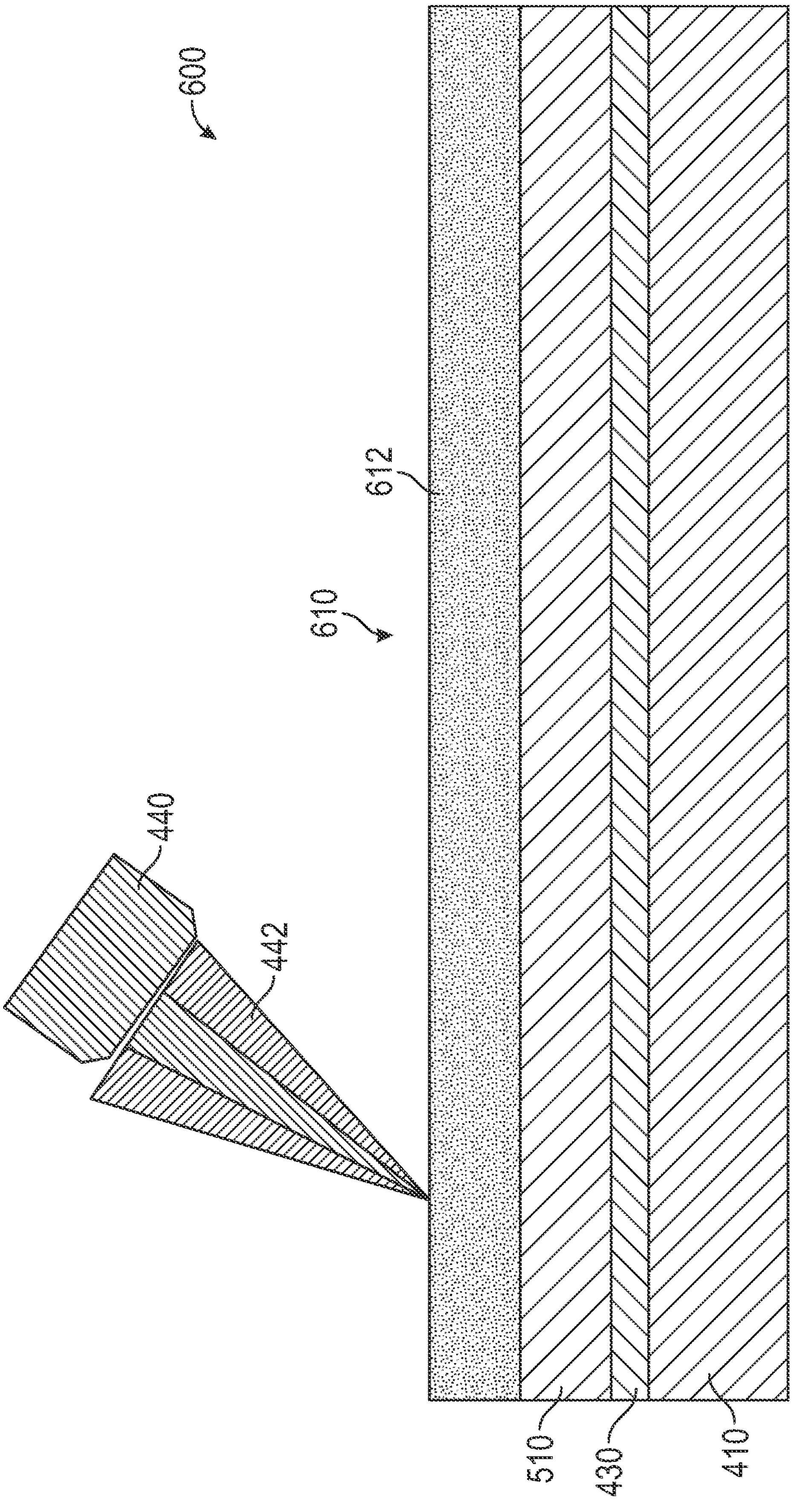
FIG. 6 illustrates a method of additively manufacturing a composite structure according to at least one example of the present disclosure.

FIG. 6 illustrates an example of building 600 a second ceramic layer 610 over the first ceramic layer 510. Constructing the second ceramic layer includes, for example, depositing a second layer of ceramic powder 612 on the first ceramic layer 510. In an example, the second layer of ceramic powder 612 is the same ceramic as the first layer of ceramic powder 512. In other examples, the second layer of ceramic powder is a different ceramic from the first layer of ceramic powder 512. The deposition of the second layer of ceramic powder 612 optionally has piezoelectric characteristics. The deposited second layer of ceramic material is deposited, for example, in as a powder or a slurry (while a powder is discussed, a slurry is also contemplated for deposition in similar manners). In an example, the second layer of ceramic powder 612 is deposited as a ceramic powder 612 consisting of a plurality of ceramic particles. Optionally, the deposited ceramic powder 612 includes other particulate materials. The deposited ceramic powder 512 deposited, for example, across the first layer 510. In an example the deposited second layer of ceramic powder 612 is deposited in specific locations according to the specified purpose. In examples, the deposited second layer of ceramic powder 612 is deposited to include spaces or gaps between areas of ceramic powder 612.

After the second layer of ceramic powder 612 is deposited on the first layer 510, the laser source 440 emits energy towards the second layer of ceramic powder 612. The laser 442 is supplied according to the intensity and with wavelengths for the specified purpose. The laser 442 is emitted toward the second layer of ceramic powder 612, for example, to sinter specified areas of the deposited second layer of ceramic powder 512. In examples, the energy emitted from the laser sinters the entire area, majority of, or specified locations of the second layer of ceramic powder 612 such that the second layer of ceramic powder 612 is melted and the particles of ceramic join, bind or couple together. The second layer of ceramic powder 612 is then set or cooled to form a least a portion of the second layer 610.

In examples, the second layer is a continuously extending second ceramic layer 610 that covers the first ceramic layer 510 such that the second ceramic layer 610 has the same texture, whether smooth, patterned or the like. In other examples, the second ceramic layer 610 includes recesses, gaps or other spacing between areas of the sintered and set second ceramic layer 610. Optionally, the second ceramic layer 610 has recesses, gaps or other spacing in similar location to the locations of the recesses, gaps or other spacing on the first ceramic layer 510.

Figure 7:
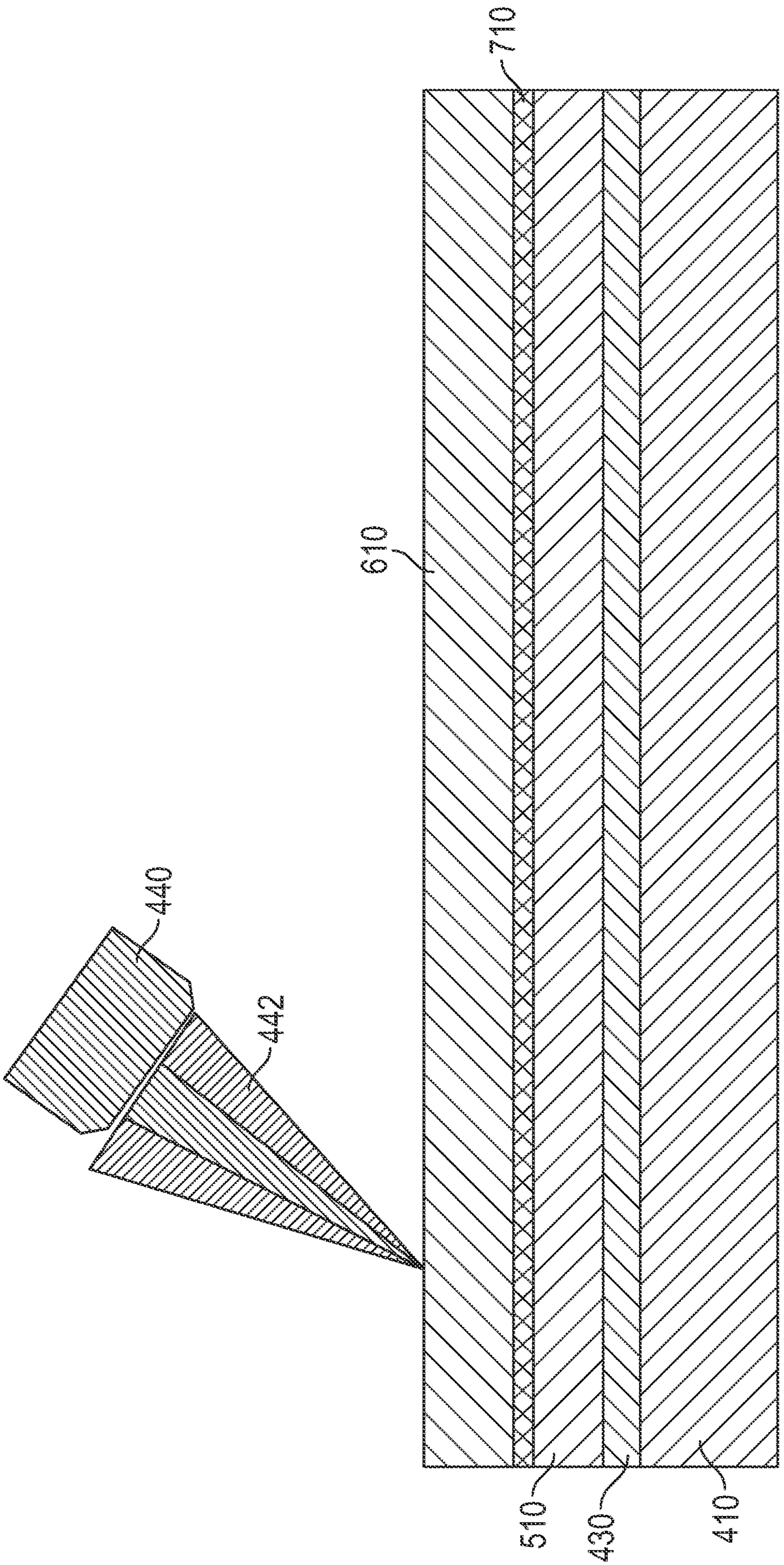
FIG. 7 illustrates a method of additively manufacturing a composite structure according to at least one example of the present disclosure.

Illustrated in FIG. 7 is an example of additively manufacturing a layered composite structure that includes a metallization layer 710 interposed between, for example, a first ceramic layer 510 and a second ceramic layer 610. For example, nickel, platinum, copper or other metal that acts as a conductor for electricity is used as a metallization layer. In an example, the metallization layer 710 is deposited on the first ceramic layer 510 after the first ceramic layer 510 was sintered and set. The metallization layer 710, in examples, is deposited on the first ceramic layer 510 as a powder or slurry. Optionally, the metallization layer, as a powder or slurry, is sintered, melted or the like with the first ceramic layer 510 from the laser source 440. Optionally, the laser source 440 emits a different laser 442 from the laser used to sinter the first or second ceramic powder layer 512, 612. The sintered, melted or otherwise coupled metallization layer 710 is then cooled or set to form a solidified metallization layer 710.

The metallization layer 710 covers, for example, the first ceramic layer 510 such that the metallization layer 710 has the same texture, whether smooth, patterned or the like. In examples, the metallization layer 710 is deposited on the first ceramic layer 510 across the first layer 510. In an example the metallization layer 710 is deposited in specific locations according to the specified purpose. In examples, the deposited metallization layer 710 is deposited to include spaces or gaps within the metallization layer 710. Optionally, the metallization layer 710 has recesses, gaps or other spacing in similar location to the locations of the recesses, gaps or other spacing on the first ceramic layer 510.

The metallization layer 710 is optionally a continuously extending metallization layer 710. The continuously extending metallization layer 710 covers, for example, the first layer 510 such that the metallization layer 710 has the same texture, whether smooth, patterned or the like. In other examples, the metallization layer 710 includes recesses, gaps or other spacing between areas of the sintered and set metallization layer 710.

In examples, the metallization layer 710 is built after one or more ceramic layers have been built and one or more ceramic layers is then built sequentially on the metallization layer. In examples, the composite structure includes one or more metallization layers 710.

Figure 8:
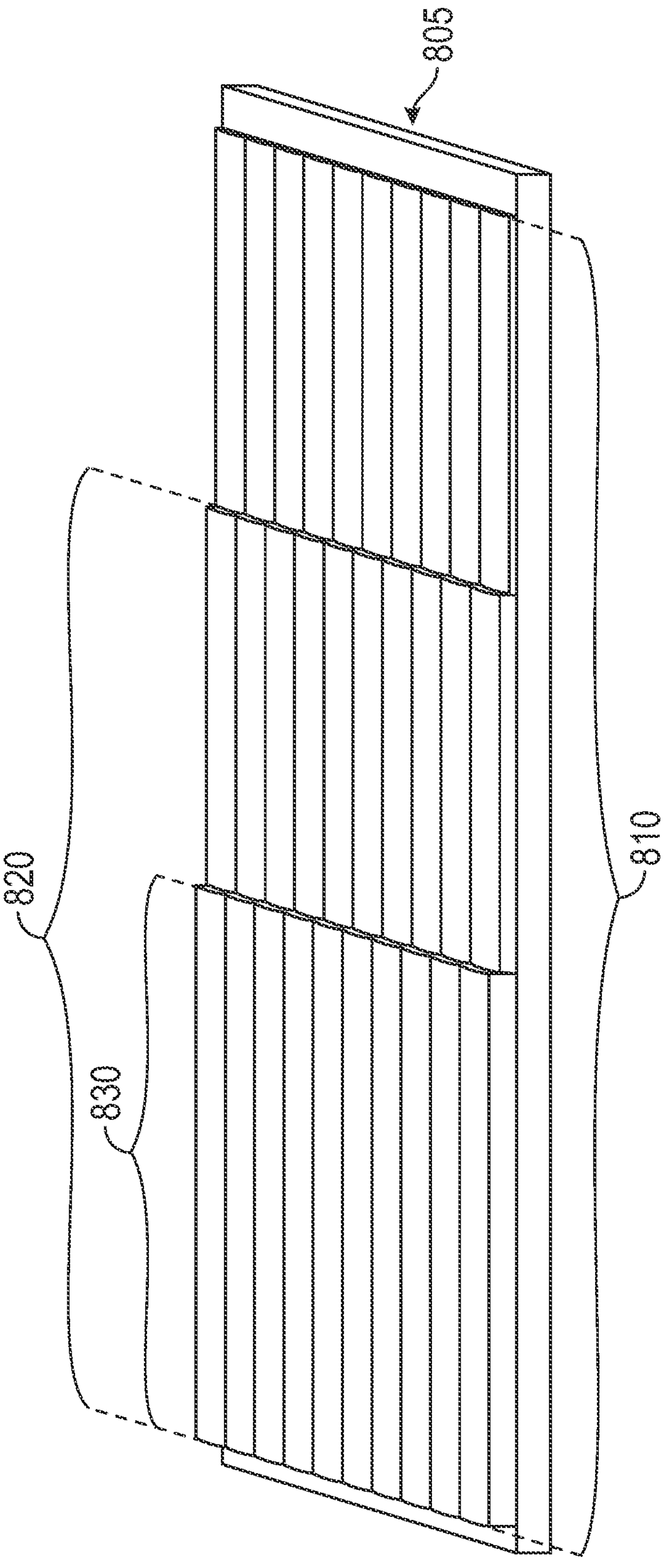
FIG. 8 illustrates an additively manufacturing a composite structure according to at least one example of the present disclosure.

Illustrated in FIG. 8 is an example of a process of building an additively manufactured layered composite structure according the methods described in, for example, FIGS. 5 and 6. As illustrated in FIG. 8 a first layer of material 810 is deposited continuously across a surface such as a build plate 805. The first layer of material 810 is then sintered (e.g., melted, coupled or the like) with a laser, then the first layer is cooled or set.

A second layer 820 is then built on the first layer. The second layer 820 is constructed by depositing either the same or a different powder material at least partially on the first layer 810. The second layer 820 of powder material is then sintered (e.g., melted, coupled or the like) with a laser. The second layer 820 is then cooled or set.

A third layer 830 is then built on the second layer 820. The third layer 830 is constructed by depositing either the same or a different powder material one or more of the first layer 810 or the second layer 820. The third layer 830 is deposited at least partially on the second layer 820. The third layer 830 of powder material is then sintered (e.g., melted, coupled or the like) with a laser. The third layer 830 is then cooled or set.

Subsequent layers of material are optionally built on previous layers in a similar process as previously described in any of FIGS. 5 through 8 until a final layered composite structure is built. In examples, the layers of layered composite structure are micromillimeters thick. In other options, the layered composite structure are at least millimeters or centimeters thick. Optionally, each layer of the composite layered structure has the same thickness. In other examples, subsequent layers have different thicknesses. For example, a first layer is thicker than the second layer or the second layer is thicker than the first layer.

In examples, electrical components are included during the building process of each layer. Optionally, one or more electrodes are including during the process of building the layers. In other examples, components are included after the composite layered structure is completed.

In examples, the final layered composite structure is included in a piezoelectric transducer. Optionally, the piezoelectric transducer is included in any of a number of final devices, such as a sensor, sonar, computer, or other mechanical or electrical device. In an example with the layered composite structure as a component of a sonar system, the sonar system includes a sonar housing having the piezoelectric transducer installed therein and an electronics control unit in communication with the piezoelectric transducer.

VARIOUS NOTES AND ASPECTS

Aspect 1 can include a method for additively manufacturing a layered composite structure, the structure having piezoelectric characteristics, the method comprising building a first ceramic layer from ceramic powder, constructing the first ceramic layer includes depositing a first layer of ceramic powder, wherein the layer of ceramic powder includes a plurality of ceramic particles; sintering at least a portion of the first layer of the ceramic powder, wherein sintering the portion of the first layer of ceramic powder melts the plurality of ceramic particles; and setting the portion of the first layer, wherein setting the portion of the first layer forms the first ceramic layer having piezoelectric characteristics; and building a second ceramic layer over the first ceramic layer, constructing the second ceramic layer includes: depositing a second layer of ceramic powder on the first ceramic layer; and sintering at least a portion of the second layer of the ceramic powder, wherein sintering the portion of the second layer of ceramic powder melts the plurality of ceramic particles; and setting at least a portion of the second layer of ceramic powder over the first ceramic layer, wherein setting the portion of the second layer forms a second ceramic layer having piezoelectric characteristics over the first ceramic layer.

Aspect 2 can include, or can optionally be combined with the subject matter of Aspect 1, to optionally include forming one of a substrate layer or the first layer on a build plate.

Aspect 3 can include, or can optionally be combined with the subject matter of one or any combination of Aspects 1 or 2 to optionally include one or more of depositing, sintering or setting are conducted to the second layer over the first ceramic layer.

Aspect 4 can include, or can optionally be combined with the subject matter of one or any combination of Aspects 1-3 to optionally include each of depositing, sintering and setting are conducted to the second layer over the first ceramic layer.

Aspect 5 can include, or can optionally be combined with the subject matter of one or any combination of Aspects 1-4 to optionally include depositing a metal layer between the first ceramic layer and the second layer.

Aspect 6 can include, or can optionally be combined with the subject matter of one or any combination of Aspects 1-5 to optionally include the ceramic powder of one or more of the first layer or the second layer includes PZT, the method includes incorporating the layered composite structure into a piezoelectric transducer.

Aspect 7 can include an additively manufactured layered composite structure, the structure having piezoelectric characteristics, comprising a first ceramic layer; and a second ceramic layer having a deposition configuration and a set configuration; wherein, in the deposition configuration a ceramic powder is applied over the first ceramic layer as a powder layer; wherein in the set configuration the ceramic powder is sintered over the first ceramic layer as a sintered layer.

Aspect 8 can include, or can optionally be combined with the subject matter of one or any combination of Aspects 6 or 7 to optionally include in the deposition configuration, the ceramic powder is dispersed in IPA or acetone.

Aspect 9 can include, or can optionally be combined with the subject matter of one or any combination of Aspects 6 to 8 to optionally include a plurality of subsequent layers, each subsequent layer having a subsequent deposition configuration and a subsequent set configuration; wherein, in the subsequent deposition configuration a ceramic powder is applied over a preceding ceramic layer as a powder layer; wherein in the subsequent set configuration the ceramic powder is sintered over the preceding ceramic layer as a sintered layer.

Aspect 10 can include, or can optionally be combined with the subject matter of one or any combination of Aspects 6 to 9 to optionally include the first layer is thicker than the second layer.

Aspect 11 can include, or can optionally be combined with the subject matter of one or any combination of Aspects 6 to 10 to optionally include the ceramic powder includes PZT.

Aspect 12 can include, or can optionally be combined with the subject matter of one or any combination of Aspects 6 to 11 to optionally include the first layer has a first deposition configuration and a first set configuration; wherein, in the first deposition configuration a ceramic powder is applied over one over a base plate or a template layer; wherein in the first set configuration the ceramic powder is sintered over the base plate or the template layer as a sintered first layer.

Aspect 13 can include, or can optionally be combined with the subject matter of one or any combination of Aspects 6 to 12 to optionally include including a metallization layer deposited on one or more of the first layer or the second layer, the metal includes an electrically conductive material.

Aspect 14 can include, or can optionally be combined with the subject matter of one or any combination of Aspects 6 to 13 to optionally include a plurality of subsequent layers; wherein one or more of the plurality of subsequent layers has a deposition configuration and a set configuration; wherein, in the deposition configuration a ceramic powder is applied over a previous layer as a powder layer; wherein in the set configuration the ceramic powder is sintered over the previous layer as a sintered layer.

Aspect 15 can include, or can optionally be combined with the subject matter of one or any combination of Aspects 6 to 14 to optionally include the layered composite structure is a component of a piezoelectric transducer; wherein the piezoelectric transducer is a component of a sonar system. a sonar housing having the piezoelectric transducer installed therein; and Aspect 16 can include, or can optionally be combined with the subject matter of one or any combination of Aspects 6 to 15 to optionally include an electronics control unit in communication with the piezoelectric transducer.

Aspect 17 can include A sonar device comprising: a piezoelectric transducer having an additively manufactured composite layered structure, comprising: a first ceramic layer includes a deposition configuration and a set configuration: wherein in the deposition configuration a ceramic powder is applied over a build plate as a first powder layer; wherein in the set configuration the ceramic powder is sintered over the build plate as a first sintered layer; and a second ceramic layer built over the first ceramic layer, the second ceramic layer includes a second deposition configuration and a second set configuration: wherein in the second deposition configuration the ceramic powder is applied over the first sintered layer as a second powder layer; wherein in the set configuration the ceramic powder is sintered over the first sintered layer as a second sintered layer; wherein at least one of the first ceramic layer or the second ceramic layer includes piezoelectric characteristics.

Aspect 18 can include, or can optionally be combined with the subject matter of one or any combination of Aspects 16 or 17 to optionally include wherein the ceramic powder includes PZT.

Aspect 19 can include, or can optionally be combined with the subject matter of one or any combination of Aspects 16 to 18 to optionally include a metallization layer between the first ceramic layer and the second ceramic layer.

Aspect 20 can include, or can optionally be combined with the subject matter of one or any combination of Aspects 16 to 19 to optionally include one or more of the first layer or the second layer includes a textured surface or a patterned surface.

Each of these non-limiting aspects can stand on its own, or can be combined in various permutations or combinations with one or more of the other aspects.

The above description includes references to the accompanying drawings, which form a part of the detailed description. The drawings show, by way of illustration, specific embodiments in which the invention can be practiced. These embodiments are also referred to herein as "aspects" or "examples." Such aspects or example can include elements in addition to those shown or described. However, the present inventors also contemplate aspects or examples in which only those elements shown or described are provided. Moreover, the present inventors also contemplate aspects or examples using any combination or permutation of those elements shown or described (or one or more features thereof), either with respect to a particular aspects or examples (or one or more features thereof), or with respect to other Aspects (or one or more features thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The above description is intended to be illustrative, and not restrictive. For example, the above-described aspects or examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as aspects, examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for additively manufacturing a layered composite structure the method comprising:

building a first ceramic layer from ceramic powder having piezoelectric characteristics, building the first ceramic layer including:

depositing a first layer of ceramic powder, wherein the first layer of ceramic powder includes a plurality of ceramic particles;

sintering at least a portion of the first layer of the ceramic powder;

wherein sintering the portion of the first layer includes emitting a first beam at a first intensity to melt the plurality of ceramic particles, followed by emitting a second beam at a second intensity lower than the first intensity, the second beam providing localized heating beyond a sintering zone of the first beam to control a rate of setting of the first layer; and setting the portion of the first layer, wherein setting the portion of the first layer forms the first ceramic layer having piezoelectric characteristics; and building a second ceramic layer over the first ceramic layer, constructing the second ceramic layer includes:

depositing a second layer of ceramic powder on the first ceramic layer;

sintering at least a portion of the second layer of the ceramic powder;

wherein sintering the portion of the second layer includes emitting the first beam at the first intensity to melt the plurality of ceramic particles, followed by emitting the second beam at the second intensity lower than the first intensity, the second beam providing localized heating beyond a sintering zone of the first beam to control a rate of setting of the second layer; and setting at least a portion of the second layer of ceramic powder over the first ceramic layer, wherein setting the portion of the second layer forms a second ceramic layer having piezoelectric characteristics over the first ceramic layer.

2. The method for additively manufacturing the layered composite structure of claim 1, including:

forming one of a substrate layer or the first layer on a build plate;

wherein the first ceramic layer is similarly formed as a build plate on which the first ceramic layer was formed;

wherein the first ceramic layer is configured as a template for one or more subsequent layers formed on top of the first ceramic layer.

3. The method for additively manufacturing the layered composite structure of claim 1, wherein one or more of depositing, sintering or setting are conducted over the second layer.

4. The method for additively manufacturing the layered composite structure of claim 1, wherein each of depositing, sintering and setting are conducted to the second layer over the first ceramic layer.

5. The method for additively manufacturing the layered composite structure of claim 1, including depositing a metal layer between the first ceramic layer and the second ceramic layer.

6. The method for additively manufacturing the layered composite structure of claim 1, wherein the ceramic powder of one or more of the first layer or the second layer includes lead zirconate titanate (PZT), the method includes:

incorporating the layered composite structure into a piezoelectric transducer.

7. An additively manufactured layered composite structure comprising:

a first ceramic layer;

wherein the first ceramic layer includes a ceramic powder having piezoelectric characteristics;

a second ceramic layer having a deposition configuration and a set configuration;

wherein, in the deposition configuration a ceramic powder including one or more piezoelectric characteristics is applied over the first ceramic layer as a powder layer;

wherein in the set configuration the ceramic powder of the second ceramic layer is sintered over the first ceramic layer as a sintered layer; and wherein sintering the ceramic powder of the second ceramic layer includes emitting a first beam at a first intensity to melt a plurality of ceramic particles of the ceramic powder of the second ceramic layer, followed by emitting a second beam at a second intensity lower than the first intensity, the second beam providing localized heating beyond a sintering zone of the first beam to control a rate of setting of the second layer.

8. The layered composite structure of claim 7, wherein in the deposition configuration, the ceramic powder is dispersed in isopropyl alcohol (IPA) or acetone.

9. The layered composite structure of claim 7, including a plurality of subsequent layers, each subsequent layer having a subsequent deposition configuration and a subsequent set configuration over a preceding ceramic layer;

wherein, in the subsequent deposition configuration a ceramic powder is applied over the preceding ceramic layer as a powder layer; and wherein in the subsequent set configuration the ceramic powder is sintered over the preceding ceramic layer as a sintered layer.

10. The layered composite structure of claim 7, wherein the first layer is thicker than the second layer.

11. The layered composite structure of claim 7, wherein the ceramic powder includes lead zirconate titanate (PZT).

12. The layered composite structure of claim 7, wherein the first layer has a first deposition configuration and a first set configuration;

wherein, in the first deposition configuration a ceramic powder is applied over one over a base plate or a template layer; and wherein in the first set configuration the ceramic powder is sintered over the base plate or the template layer as a sintered first layer.

13. The layered composite structure of claim 7, including a metallization layer deposited on one or more of the first layer or the second layer, the metal includes an electrically conductive material.

14. The layered composite structure of claim 7, including a plurality of subsequent layers;

wherein one or more of the plurality of subsequent layers has a deposition configuration and a set configuration over a previous layer;

wherein, in the deposition configuration a ceramic powder is applied over a previous layer as a powder layer;

wherein in the set configuration the ceramic powder is sintered over the previous layer as a sintered layer;

wherein in the set configuration of the first ceramic layer, the first ceramic layer includes a similar form as a build plate on which the first ceramic layer was formed; and wherein the first ceramic layer is configured as a template for one or more subsequent layers formed on top of the first ceramic layer.

15. The layered composite structure of claim 7, wherein the layered composite structure is a component of a piezoelectric transducer;

wherein the piezoelectric transducer is a component of a sonar system.

16. The layered composite structure of claim 15 including:

a sonar housing having the piezoelectric transducer installed therein; and an electronics control unit in communication with the piezoelectric transducer.

17. A sonar device comprising:

a piezoelectric transducer having an additively manufactured composite layered structure, comprising:

a first ceramic layer having piezoelectric characteristics includes a deposition configuration and a set configuration:

wherein in the deposition configuration a ceramic powder is applied over a build plate as a first powder layer;

wherein in the set configuration the ceramic powder is configured to be sintered over the build plate as a first sintered layer;

wherein sintering a portion of the first ceramic layer includes a first beam configured to be emitted at a first intensity to sinter a plurality of first ceramic particles of the ceramic powder, followed by a second beam configured to be emitted at a second intensity lower than the first intensity, the second beam configured to provide localized heating beyond a sintering zone of the first beam to control a rate of setting of the first layer; and a second ceramic layer having piezoelectric characteristics built over the first ceramic layer, the second ceramic layer includes a second deposition configuration and a second set configuration:

wherein in the second deposition configuration the ceramic powder is applied over the first sintered layer as a second powder layer;

wherein in the set configuration the ceramic powder is configured to be sintered over the first sintered layer as a second sintered layer;

wherein sintering the portion of the second layer includes the first beam at the first intensity configured to sinter the plurality of second ceramic particles of the ceramic powder, followed by the second beam configured to emit at the second intensity lower than the first intensity, the second beam configured to provide localized heating beyond a sintering zone of the first beam to control a rate of setting of the second layer;

wherein at least one of the first ceramic layer or the second ceramic layer includes piezoelectric characteristics.

18. The sonar device of claim 17, wherein the ceramic powder includes lead zirconate titanate (PZT).

19. The sonar device of claim 17, including a metallization layer applied between the first ceramic layer and the second ceramic layer; and one or more subsequent ceramic layers formed over a preceding layer, each subsequent ceramic layer includes:

in a subsequent deposition configuration the ceramic powder is applied over the preceding ceramic powder layer; and in a subsequent set configuration the ceramic powder is sintered over the preceding sintered layer as a subsequent sintered layer.

20. The sonar device of claim 17, wherein one or more of the first layer or the second layer includes a textured surface or a patterned surface;

wherein the first ceramic layer is similarly formed as a build plate on which the first ceramic layer was formed;

wherein the first ceramic layer is configured as a template for one or more subsequent layers formed on top of the first ceramic layer.

* * * * *